(12) United States Patent
Alphonse

(10) Patent No.: US 6,363,188 B1
(45) Date of Patent: Mar. 26, 2002

(54) MODE EXPANDER WITH CO-DIRECTIONAL GRATING

(75) Inventor: Gerard Argant Alphonse, Princeton, NJ (US)

(73) Assignee: Princeton Lightwave, Inc.

( * ) Notice: Subject to any disclaimer, the term of this patent is extended or adjusted under 35 U.S.C. 154(b) by 0 days.

(21) Appl. No.: 09/571,211

(22) Filed: May 16, 2000

Related U.S. Application Data

(60) Provisional application No. 60/161,213, filed on Oct. 22, 1999.

(51) Int. Cl.$^7$ .................................................. G02B 6/34
(52) U.S. Cl. .......................... 385/37; 385/43; 385/123; 385/126
(58) Field of Search ............................... 385/37, 10, 43, 385/31, 123, 124, 126, 127

(56) References Cited

U.S. PATENT DOCUMENTS 6,240,224 B1 * 5/2001 Reekie et al. ................. 385/37
6,275,627 B1 * 8/2001 Wu ............................. 385/28

* cited by examiner

Primary Examiner—Hemang Sanghavi
Assistant Examiner—Scott Knauss
(74) Attorney, Agent, or Firm—Arthur L. Plevy; Duane Morris LLP

(57) ABSTRACT

An apparatus comprises a first waveguide, a second waveguide and a transitional coupler. The first waveguide is defined by a first material and a second material. The first waveguide has a core and a cladding. The first material is the core of the first waveguide, and the second material is the cladding of the first waveguide. The second waveguide is defined by a third material and a fourth material. The second waveguide has a core and a cladding. The third material is the core of the second waveguide, and the fourth material is the cladding of the second waveguide. A cross-section of the core of the second waveguide is larger than a cross-section of the core of the first waveguide. The transitional coupler has a first end integrally formed with and operationally coupled to the first waveguide, and has a second end integrally formed with and operationally coupled to the second waveguide. The transitional coupler includes a co-directional grating.

23 Claims, 1 Drawing Sheet

TOP VIEW

SIDE VIEW

MODE EXPANDER WITH CO-DIRECTIONAL GRATING

CO-PENDING RELATED APPLICATIONS

The present application claims priority to co-pending provisional application, U.S. Serial No. 60/161,213 filed on Oct. 22, 1999, entitled "Integrated High Power Semiconductor Laser."

The present application is related to the application entitled "Integrated High Power Semiconductor Laser" (Ser. No. 09/571,970) by the same inventor, filed on the same day and which is incorporated herein by reference.

BACKGROUND

The present invention relates generally to optical devices. More specifically, the present invention relates to a mode expander with a co-directional grating.

Telecommunications is a large and fast growing industry. This growth has been enabled, at least in part, by the use of optical amplifiers to extend the range of long-haul optical transmission and by the deployment of Dense Wavelength Division Multiplexing (WDM) systems to increase the optical channel capacity. These technologies have been improved by extending the bandwidth of Erbium-Doped Fiber Amplifier (EDFA) optical amplifiers from about 20 nm to about 80 nm.

A technical challenge in extending the bandwidth of EDFAs has been the need to provide enough gain in the EDFAs over the entire bandwidth. This can be accomplished by single-mode 980 nm or 1480 nm laser pumps with output powers on the order of 1 Watt or more. Known laser pumps for EDFAs are single-mode semiconductor narrow-stripe pump lasers limited to about 150 mW in a single-mode fiber. This limitation is due to catastrophic optical damage that can occur if the optical power density at the facet of the laser exceeds about 1 to $2 \times 10^7$ W/cm$^2$ and due to the fact that stripe laser is narrow (e.g., 3–5 $\mu$m) to ensure single-mode operation.

To overcome the limitation relating to the optical power density, the cross-section area of the laser's active region must be widened to reduce the power density in the laser stripe (i.e., the active region), especially at the facet of the laser. Widening the cross-section area of the laser's active region, however, conflicts with the design constraint of single-mode operation. Thus, a need exists to increase the cross-sectional area of the portion of an output facet of a laser through which light is transmitted while maintaining single-mode operation. More generally, a need exists to couple light from one waveguide having, for example, a narrow oval-like cross-sectional area, to another waveguide having, for example, a larger cross-sectional area.

SUMMARY OF THE INVENTION

An apparatus comprises a first waveguide, a second waveguide and a transitional coupler. The first waveguide is defined by a first material and a second material. The first waveguide has a core and a cladding. The first material is the core of the first waveguide, and the second material is the cladding of the first waveguide. The second waveguide is defined by a third material and a fourth material. The second waveguide has a core and a cladding. The third material is the core of the second waveguide, and the fourth material is the cladding of the second waveguide. A cross-section of the core of the second waveguide is larger than a cross-section of the core of the first waveguide. The transitional coupler has a first end integrally formed with and operationally coupled to the first waveguide, and has a second end integrally formed with and operationally coupled to the second waveguide. The transitional coupler includes a co-directional grating.

DETAILED DESCRIPTION

An apparatus comprises a first waveguide, a second waveguide and a transitional coupler. The first waveguide is defined by a first material and a second material. The first waveguide has a core and a cladding. The first material is the core of the first waveguide, and the second material is the cladding of the first waveguide. The second waveguide is defined by a third material and a fourth material. The second waveguide has a core and a cladding. The third material is the core of the second waveguide, and the fourth material is the cladding of the second waveguide. A cross-section of the core of the second waveguide is larger than a cross-section of the core of the first waveguide. The transitional coupler has a first end integrally formed with and operationally coupled to the first waveguide, and has a second end integrally formed with and operationally coupled to the second waveguide. The transitional coupler includes a co-directional grating.

In one embodiment of the present invention, the cross-section of the core of the second waveguide, but not that of the first waveguide, is of a similar size and shape as that of, for example, an erbium-doped fiber amplifier (EDFA) fiber pigtail. For example, the cross-section of the core of the first waveguide can have a narrow oval-like shape and the cross-section of the core of the second waveguide can have a more circular shape with a greater area than that of the first waveguide. By appropriately selecting the grating period, length and location of the co-directional grating in the transitional coupler, the coupling efficiency can be appropriately 100%. This advantageously allows the more circular shape of the second waveguide to be, for example, comparable to the mode diameter of a single-mode fiber pigtail for EDFA pumping applications. Thus, fiber coupling efficiency can be high and coupling can be performed with minimum optical devices. In some instances, the second waveguide can be directly coupled to a single-mode fiber pigtail without any intervening coupling optical devices (e.g., cylindrical lens as can be otherwise necessary with a stripe-shaped active region that produces an output beam with a narrow oval cross-sectional shape).

The term "coupled" is used herein to include, but is not limited to, two components being associated such that energy sent by one component is received by the other component. Where the components are optical components sending and receiving light, the optical components can be connected, for example, by their physical arrangement so that one component sends light along an optical path and the other component receives the light along that path. Alternatively, optical components can be connected, for example, by an optical fiber(s), fiber-coupling device(s)

and/or collimator(s) as appropriate, to maximize the light sent and received. Where the components are electronic components, they can be coupled by, for example, conventional wiring.

Figure 1:
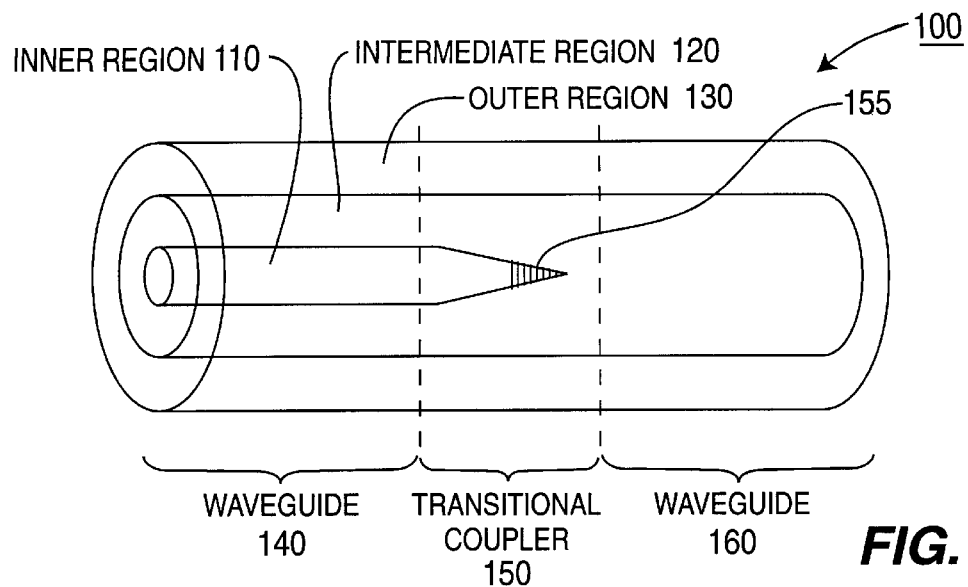
FIG. 1 illustrates a first waveguide, a transitional coupler and a second waveguide integrally formed, according to an embodiment of the present invention.

FIG. 1 illustrates an optical device having a first waveguide, a transitional coupler and a second waveguide integrally formed, according to an embodiment of the present invention. The optical device 100 includes an inner region 110, intermediate region 120 and an outer region 130. A first waveguide 140 includes a first portion of inner region 110, a first portion of intermediate region 120 and a first portion of outer region 130. A transitional coupler 150 includes a second portion of inner region 110, a second portion of intermediate region 120 and a second portion of outer region 130. A second waveguide 160 includes a third portion of intermediate region 120 and a third portion of outer region 130.

Inner region 110 has a refractive index greater than the refractive index of intermediate region 120. Similarly, the refractive index of intermediate region 120 is greater than outer region 130. Thus, the inner region 110 in the first waveguide 140 acts as a core and the intermediate region 120 in the first waveguide 140 acts as a cladding due to the differences in their refractive indices. The transitional coupler 150 allows light to be coupled from the first waveguide 140 into the second waveguide 150, and vice versa, where the core cross-sectional areas of the two waveguides are different.

The portion of the inner region 110 in the transitional coupler 150 has a taper and includes a co-directional coupler 155. Although the co-directional coupler 155 is shown in FIG. 1 as being disposed at the end of the inner region 110, the co-directional grating 155 need not be so disposed. Alternatively, the co-directional grating 155 can be disposed within inner region 110 at any position (e.g., other than at the end of inner region 110) where electromagnetic field of the first waveguide 140 overlaps with the electromagnetic field of the second waveguide 160.

The co-directional coupler 155 has a grating period, Λ, determined by the difference between the propagation characteristic, $\beta_1$, of the first waveguide 140 and the propagation characteristic, $\beta_2$, of the second waveguide 160. Where the refractive index of the inner region 110 in the first waveguide 140 is $n_1$, the refractive index of the intermediate region 120 in the second waveguide 160 is $n_2$, and the wavelength of the propagating light is λ, then propagation characteristics are:

$$\beta_1 = 2\pi n_1/\lambda;$$

$$\beta_2 = 2\pi n_2/\lambda.$$

The grating period, Λ, is defined by the following relationship:

$$\beta_1 - \beta_2 = 2\pi/\Lambda.$$

The coupling coefficiency, η, between the first waveguide 140 and the second waveguide 160 is determined by the following:

$$\eta = \frac{1}{1+\sigma} \sin^2(k_c L \sqrt{1+\sigma^2}),$$

where $\sigma = (\beta_1 - \beta_2)/2k_c$, where $k_c$ is the coupling coefficient between the first waveguide 140 and the second waveguide 160 (obtained by calculating the overlap integral of the waveguide fields over the grating area), and where L is the length of the co-directional grating 155. As the equation for the coupling efficient, η, above shows, for any given grating coefficient, $k_c$, a grating length, L, can be selected so that about 100% of the light from the first waveguide 140 can be transmitted into the second waveguide 160.

Now consider light propagating from the first waveguide 140 into the transitional coupler 150 and, in turn, into the second waveguide 150. In the transitional coupler 150, the tapered shape of the inner region in the transitional coupler 150 increasingly couples the light from the inner region 110 into the intermediate region 120 as light travels into the transitional coupler 150 so that the intermediate region 120 acts as a core and the outer region 130 in the transitional coupler 150 acts a cladding due to the difference in their refractive indices (i.e., because the refractive index of the intermediate region 120 is greater than the refractive index of the outer region 130). The same occurs in the second waveguide 160 where the intermediate region 120 acts as a core and the outer region 130 acts as a cladding.

Note that although inner region 110 is shown in FIG. 1 as being disposed symmetrically within intermediate region 120, the inner region 110 need not be so disposed. In other words, inner region 110 can be disposed within intermediate region 120 so that a portion of intermediate region 120 on one side of inner region 110 has a different size than portion of intermediate region 120 on the other side of inner region 110. The specific size of the intermediate region 120 around inner region 110 need only be sufficient in size to maintain waveguide-like propagation of light within the first waveguide 140. Similarly, although intermediate region 120 is shown in FIG. 1 as being disposed symmetrically within outer region 130, the intermediate region 120 need not be so disposed. The specific size of the outer region 130 around intermediate region 120 need only be sufficient in size to maintain waveguide-like propagation of light within the second waveguide 160.

Figure 2:
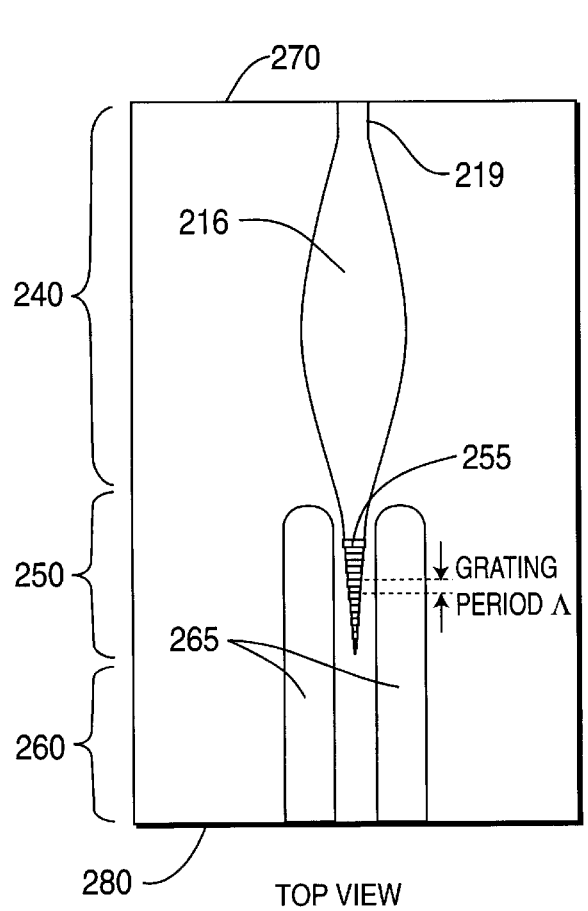
FIG. 2 illustrates a top view of an optical device having a slab waveguide structure, according to an embodiment of the present invention.
Figure 3:
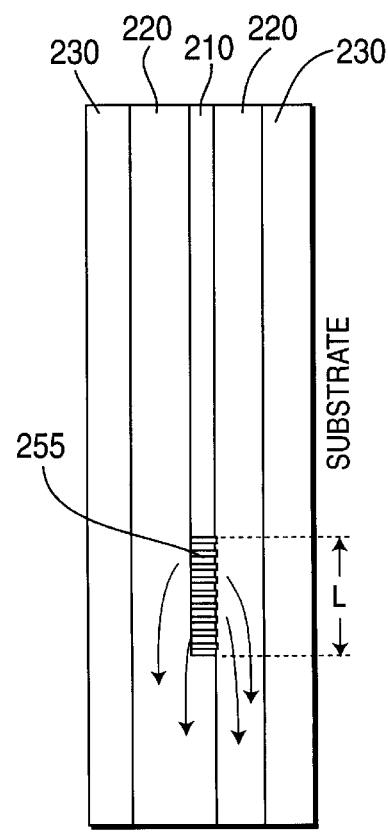
FIG. 3 illustrates a side view of the optical device shown in FIG. 2.

Although FIG. 1 illustrates two waveguides having a cylindrical waveguide structure, other types of waveguide structures are possible. For example, FIG. 2 illustrates a top view of an optical device having a slab waveguide structure, according to an embodiment of the present invention. FIG. 3 illustrates a side view of the optical device shown in FIG. 2.

Optical device 200 is an integrated laser described in detail in U.S. Application "Integrated High Power Semiconductor Laser"Ser. No. 09/571,970 , which is incorporated by reference. The various portions of the integrated laser 200 are fabricated as layers. The integrated laser 200 includes first waveguide 240, transitional coupler 250 and a second waveguide 260. First waveguide 240 includes a portion of inner region 210 (which is an active region), a portion of intermediate region 220 and a portion of outer region 230. The integrated laser 200 includes a reflector portion 270 and a partial reflector portion 280 which define the resonance cavity of the integrated laser 200.

Inner region 210 includes a straight portion 214, an extended portion 216 and a tapered portion having the co-directional grating 255. The straight portion 214 and the extended portion 216 are within the first waveguide 240. The co-directional grating 255 are within transitional coupler 250. The second waveguide 260 includes grooves 265 etched in one side of the outer region 230. As described the above-mentioned patent application, these grooves 265 provide lateral confinement so that the second waveguide 260 can be configured as a single-mode waveguide.

In this embodiment, the transitional coupler 250 allows the light to be transferred from the first waveguide 240 into the second waveguide 250, and vice versa. The first waveguide 240 has a slab waveguide structure defined by the inner region 210 acting as a core in the first waveguide 240 and the intermediate region 220 acting as a cladding in the first waveguide 240. The width of this slab waveguide structure can be less than the corresponding width of the waveguide structure of the second waveguide (which also includes lateral confinement due to grooves 265). Said another way, the cross-sectional area of the light beam between the first waveguide 240 and transitional coupler 250 can be less than the cross-sectional area of the light beam between the transitional coupler 250 and the second waveguide 260. In addition, the former can have a narrow oval shape and the latter can have a more circular shape. Consequently, the more circular shape of the second waveguide can be, for example, comparable to the mode diameter of a single-mode fiber pigtail for EDFA pumping applications.

It should, of course, be understood that while the present invention has been described in reference to particular configurations, other configurations should be apparent to those of ordinary skill in the art. For example, although embodiments of the present invention are described in reference to particular arrangements, embodiments of the present invention can be applied to any two types of waveguides having different propagation contacts.

What is claimed is:

1. An apparatus, comprising:
    a first layer having a refractive index;
    a second layer having a first portion and a second portion, said second layer having a refractive index greater than the refractive index of said first layer;
    a third layer having a refractive index greater than the refractive index of said second layer, said third layer having a co-directional grating, the first portion of said second layer being disposed between said first layer and said third layer;
    a fourth layer having a first portion and a second portion, said fourth layer having the refractive index of said second layer, said third layer being disposed between the first portion of said second layer and the first portion of said fourth layer; and
    a fifth layer having the refractive index of said first layer, the first portion of said fourth layer being disposed between said third layer and said fifth layer, the second portion of said fourth layer being disposed between said fifth layer and the second portion of said second layer.

2. The apparatus of claim 1, wherein:
    the first portion of said second layer and the first portion of said fourth layer are operatively associated with said third layer such that said third layer defines a core of a first waveguide and such that the first portion of said second layer and the first portion of said fourth layer define a cladding of the first waveguide; and
    said first layer and said fifth layer are operatively associated with the second portion of said second layer and the second portion of said fourth layer, respectively, such that the second portion of said second layer and the second portion of said fourth layer define a core of a second waveguide and such that said first layer and said fifth layer define a cladding of the second waveguide.

3. The apparatus of claim 1, wherein:
    the co-directional grating of said third layer has a grating period that is a function of a propagation characteristic of said third layer, a propagation characteristic of said second layer and a propagation characteristic of said fourth layer.

4. The apparatus of claim 1, wherein:
    the co-directional grating of said third layer has a grating period that is a function of a propagation characteristic of said third layer, a propagation characteristic of said second layer and a propagation characteristic of said fourth layer.

5. The apparatus of claim 1, wherein:
    the co-directional grating of said third layer has a length and a grating period that maximizes coupling of light from said third layer into the second portion of said second layer and the second portion of said fourth layer.

6. The apparatus of claim 1, wherein:
    the co-directional grating of said third layer has a grating period, a propagation characteristic of said third layer substantially matching a propagation characteristic of said second layer and a propagation characteristic of said fourth layer plus two pi over the grating period.

7. The apparatus of claim 1, wherein:
    said third layer has a first end adjacent to the second portion of said second layer and the second portion of said fourth layer, the co-directional grating of said third layer being disposed at the first end of said third layer.

8. The apparatus of claim 1, wherein:
    said third layer has a first end adjacent to the second portion of said second layer and the second portion of said fourth layer, the co-directional grating of said third layer being disposed within a portion said third layer associated with the first portion of said second layer and with the first portion of said fourth layer.

9. An apparatus, comprising:
    an inner region having a refractive index and having a first portion and a second portion, the second portion of said inner region including a co-directional grating;
    an intermediate region having a refractive index less than the refractive index of said inner region, said intermediate region having a first portion, a second portion and a third portion, the first portion of said inner region being disposed within the first portion of said intermediate region, the second portion of said inner region being disposed within the second portion of said intermediate portion; and
    an outer region having a refractive index less than the refractive index of said intermediate region, said intermediate region being disposed within said outer region.

10. The apparatus of claim 9, wherein:
    the first portion of said intermediate region is operatively associated with the first portion of said inner region such that the first portion of said inner region defines a core of a first waveguide and such that the first portion of said intermediate region defines a cladding of the first waveguide;
    said outer region is operatively associated with the third portion of said intermediate region such that the third portion of said intermediate region defines a core of a second waveguide and such that said outer region defines a cladding of the second waveguide.

11. The apparatus of claim 9, wherein:
    the co-directional grating of said inner region has a length that is a function of a propagation characteristic of the second portion of said inner region and a propagation characteristic of the second portion of said intermediate region.

12. The apparatus of claim 9, wherein:

the co-directional grating of said inner region has a grating period that is a function of a propagation characteristic of said inner region and a propagation characteristic of the first portion of said intermediate region.

13. The apparatus of claim 9, wherein:

the co-directional grating of said inner region has a length and a grating period that maximizes coupling of light from the second portion of said inner region into the third portion of said intermediate region.

14. The apparatus of claim 9, wherein:

the co-directional grating of said inner region has a grating period, a propagation characteristic of the second portion of said inner region substantially matching a propagation characteristic of the third portion of said intermediate region plus two pi over the grating period.

15. The apparatus of claim 9, wherein:

the second portion of said inner region has a first end adjacent to the third portion of the intermediate region, the co-directional grating of said inner region being disposed at the first end of the second portion of said inner region.

16. An apparatus, comprising:

a first waveguide defined by a first material and a second material, said first waveguide having a core and a cladding, the first material being the core of said first waveguide, the second material being the cladding of said first waveguide;

a second waveguide defined by a third material and a fourth material, said second waveguide having a core and a cladding, the third material being the core of said second waveguide, the fourth material being the cladding of said second waveguide, a cross-section of the core of said second waveguide being larger than a cross-section of the core of said first waveguide; and a transitional coupler having a first end integrally formed with and operationally coupled to said first waveguide and having a second end integrally formed with and operationally coupled to said second waveguide, said transitional coupler including a co-directional grating.

17. The apparatus of claim 16, wherein:

the first material has a refractive index, the second material has a refractive index less than the refractive index of the first material; and the fourth material has a refractive index less than a refractive index of the third portion.

18. The apparatus of claim 16, wherein:

said first waveguide has a first cylindrical waveguide structure, said second waveguide has a second cylindrical waveguide structure.

19. The apparatus of claim 16, wherein:

said first waveguide has a first rectangular waveguide structure, said second waveguide has a second rectangular waveguide structure.

20. The apparatus of claim 16, wherein:

the co-directional grating of said transitional coupler is constructed of the first material and is adjacent to at least one from the group of the second material and the third material.

21. The apparatus of claim 16, wherein the second material of said first waveguide matches the third material of said second waveguide.

22. The apparatus of claim 16, wherein:

the co-directional grating of said transitional coupler has a grating period that is a function of a propagation characteristic of the first material and a propagation characteristic of the third material.

23. The apparatus of claim 16, wherein:

the co-directional grating of said transitional coupler has a length and a grating period that maximizes coupling of light from the first material into the third material.

* * * * *